(12) United States Patent
Matsuzuka

(10) Patent No.: US 7,397,318 B2
(45) Date of Patent: Jul. 8, 2008

(54) VOLTAGE-CONTROLLED OSCILLATOR

(75) Inventor: Takayuki Matsuzuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 98 days.

(21) Appl. No.: 11/563,757

(22) Filed: Nov. 28, 2006

(65) Prior Publication Data
US 2007/0126520 A1 Jun. 7, 2007

(30) Foreign Application Priority Data
Dec. 1, 2005 (JP) ............... 2005-347456

(51) Int. Cl.
H03B 5/12 (2006.01)
H03L 1/02 (2006.01)
(52) U.S. Cl. ................ 331/176; 331/117 R; 331/177 V
(58) Field of Classification Search .................... 331/66, 331/69, 70, 96, 117 R, 117 FE, 117 D, 175, 331/176, 177 R, 177 V
See application file for complete search history.

(56) References Cited
U.S. PATENT DOCUMENTS
4,751,475 A  6/1988  Kubo et al.
6,040,744 A * 3/2000  Sakurai et al. ............... 331/176

FOREIGN PATENT DOCUMENTS
JP  62-021304 A1  1/1987
JP  62-031205 A1  2/1987
JP  64-049406 A1  2/1989
JP  1-300604 A1  12/1989
JP  8-008643 A1  1/1996
JP  2000-244243 A1  9/2000
JP  2004-320239 A1  11/2004

OTHER PUBLICATIONS
Kishimoto, et. Al., "A 60-Ghz-band Subharmonically Injection Laocked VCO MMIC Operating over Wide Temperature Range", International Microwave Symposium Digest, Jun. 2005.

* cited by examiner

Primary Examiner—David Mis
(74) Attorney, Agent, or Firm—Leydig, Voit & Mayer, Ltd.

(57) ABSTRACT

A voltage-controlled oscillator including a voltage-controlled oscillation section, a frequency control bias circuit, a temperature compensation bias circuit, and a temperature compensation bias generation circuit. The temperature compensation bias generation circuit has a transistor having its collector or drain connected to the temperature compensation bias circuit, a first resistor having one end connected to the collector or drain of the transistor and having another end that is grounded, a second resistor having one end connected to the base or gate of the transistor, a base or gate bias application terminal connected to another end of the second resistor, a third resistor having one end connected to the emitter or source of the transistor, and an emitter or source bias application terminal connected to another end of the third resistor.

2 Claims, 5 Drawing Sheets

VOLTAGE-CONTROLLED OSCILLATOR

BACKGROUND OF THE INVENTION

1. Field of the Invention

The present invention relates to a voltage-controlled oscillator operating in a microwave or millimeter wave region and, more particularly, to a voltage-controlled oscillator capable of easily correcting variation in oscillation frequency with temperature and shifting the range of voltage applicable across a variable-capacitance element to a region on the high-voltage side.

2. Background Art

FIG. 4 is a circuit diagram showing an example of a conventional voltage-controlled oscillator. The voltage-controlled oscillator shown in FIG. 4 has a voltage-controlled oscillation section 21 which controls the oscillation frequency by a voltage applied to a variable-capacitance element 6, and a frequency control bias circuit 7 which applies a frequency control bias to one end of the variable-capacitance element 6.

The voltage-controlled oscillation section 21 has a bipolar transistor 1, an output matching circuit 2 connected to the collector of the bipolar transistor 1, a series feedback inductor 3 connected to the emitter of the bipolar transistor 1, a phase adjustment line 4 having its one end connected to the base of the bipolar transistor 1 and satisfying an oscillation start phase condition, an inductor 5 and the variable-capacitance element 6. The inductor 5 and the variable-capacitance element 6 are connected between the other end of the phase adjustment line 4 and a grounding point and constitute an LC series resonance circuit. The frequency control bias circuit 7 is a resistance-feed-type bias circuit which applies to one end of the variable-capacitance element 6 a frequency control bias externally supplied through a frequency control bias terminal B.

FIG. 5 is a diagram schematically showing oscillation frequency characteristics of the conventional voltage-controlled oscillator. Conventionally, the voltage applied to the variable-capacitance element 6 is controlled according to temperature in order to correct variation in oscillation frequency with temperature. For example, in a case where the voltage-controlled oscillator is used by controlling the voltage to point A in FIG. 5 at ordinary temperature, the voltage is controlled to point B when the temperature is high, and is controlled to point C when the temperature is low, thus obtaining the same frequency at different temperatures.

The voltage-controlled oscillator shown in FIG. 4, however, needs to perform frequency control and temperature compensation through one terminal and therefore has a problem that it is necessary to apply a frequency control bias in a complicated way according to temperature.

FIG. 6 shows a conventional voltage-controlled oscillator devised to solve this problem (see, for example, Japanese Patent Laid-Open No. 62-21304). This voltage-controlled oscillator has, in addition to the components of the voltage-controlled oscillator shown in FIG. 4, a temperature compensation bias circuit 10 which applies a temperature compensation bias to the other end of the variable-capacitance element 6 and a temperature compensation bias generation circuit 22 which generates a temperature compensation bias and supplies the generated bias to the temperature compensation bias circuit 10. The voltage-controlled oscillation section 21 further has a direct current blocking capacitor 9 connected between the variable-capacitance element 6 and a grounding point.

The temperature compensation bias generation circuit 22 is a resistance-feed-type bias circuit. A frequency control bias supplied from the temperature compensation bias generation circuit 22 via point X is applied to the other end of the variable-capacitance element 6. The temperature compensation bias generation circuit 22 has a bipolar transistor 11 having its collector connected to the temperature compensation bias circuit 10, a resistor 12 having its one end connected to the collector of the bipolar transistor 11, a resistor 13 having its one end connected to the base of the bipolar transistor 11, a base bias application terminal 14 connected to the other end of the resistor 13, a collector bias application terminal 15 connected to the other end of the resistor 12, and a resistor 16 having its one end connected to the emitter of the bipolar transistor 11 and having the other end grounded.

While in the voltage-controlled oscillator shown in FIG. 4 the oscillation frequency becomes lower with the increase in temperature, the provision of the temperature compensation bias circuit 10 and the temperature compensation bias generation circuit 22 in the voltage-controlled oscillator shown in FIG. 6 enables the oscillator to output of a signal at a fixed frequency even when the temperature rises. The reason for this effect is as described below. With the increase in temperature, the collector current of the bipolar transistor 11 increases to increase the voltage drop across the resistor 12 and reduce the voltage at point X. The voltage across the variable-capacitance element 6 is thereby increased to increase the oscillation frequency, thus correcting the reduction in oscillation frequency due to an increase in temperature. As a result, there is no need to apply the frequency control bias in a complicated way according to temperature.

In the voltage-controlled oscillator shown in FIG. 6, the voltage at point X decreases with the increase in temperature, as shown in FIG. 7, but converges to a certain point indicated by Y in FIG. 7. An additional offset voltage corresponding to Y is thus added to the voltage used primarily for temperature compensation, so that the range of voltage applicable across the variable-capacitance element 6 is shifted to a region on the low-voltage side.

A reverse-biased diode is ordinarily used as a variable-capacitance element. As the above-mentioned value Y is increased, the voltage across the diode becomes closer to a forward bias. Therefore, the diode can be only used before a point at which the voltage across the diode becomes equal to the on voltage, as shown in FIG. 8. There is a possibility of failure to make sufficient temperature compensation. Moreover, when the voltage across the diode becomes closer to a forward bias, low-frequency noise from an external power supply and low-frequency noise generated in the diode are up-converted to the oscillation frequency band by the non-linear operation of the diode, resulting in an increase in phase noise.

For example, in the case of a voltage-controlled oscillator for a vehicle radar, the output frequency of the voltage-controlled oscillator is generally ⅛ or more of a signal frequency of 76 to 77 GHz of the vehicle radar. In the case of a voltage-controlled oscillator operating at such a high frequency, the influence of assembly accuracy on the characteristics is large and, therefore, it is desirable, from the viewpoint of productivity, to design the voltage-controlled oscillator in a monolithic (MMIC) form. However, a resonator of a high Q factor such as a dielectric resonator cannot be made on a semiconductor substrate. Therefore, a resonator provided in MMIC form has larger phase noise in comparison with those using a dielectric resonator. It is difficult to obtain a resistor in MMIC form having a sufficient margin with respect to the phase noise performance required by the vehicle radar system. For this reason, the above-described increase in phase noise in the vicinity of a forward bias has been serious.

SUMMARY OF THE INVENTION

In view of the above-described problem, an object of the present invention is to obtain a voltage-controlled oscillator capable of easily correcting variation in oscillation frequency with temperature and shifting the range of voltage applicable across a variable-capacitance element to a region on the high-voltage side.

According to one aspect of the present invention, a voltage-controlled oscillator including a voltage-controlled oscillation section, a frequency control bias circuit, a temperature compensation bias circuit, and a temperature compensation bias generation circuit. The temperature compensation bias generation circuit has a transistor having its collector or drain connected to the temperature compensation bias circuit, a first resistor having its one end connected to the collector or drain of the transistor and having the other end grounded, a second resistor having its one end connected to the base or gate of the transistor, a base or gate bias application terminal connected to the other end of the second resistor, a third resistor having its one end connected to the emitter or source of the transistor, and an emitter or source bias application terminal connected to the other end of the third resistor.

According to the present invention, it is possible to easily correct variation in oscillation frequency with temperature and shift the range of voltage applicable across a variable-capacitance element to a region on the high-voltage side.

Other and further objects, features and advantages of the invention will appear more fully from the following description.

DETAILED DESCRIPTION OF THE PREFERRED EMBODIMENTS

First Embodiment

Figure 1:
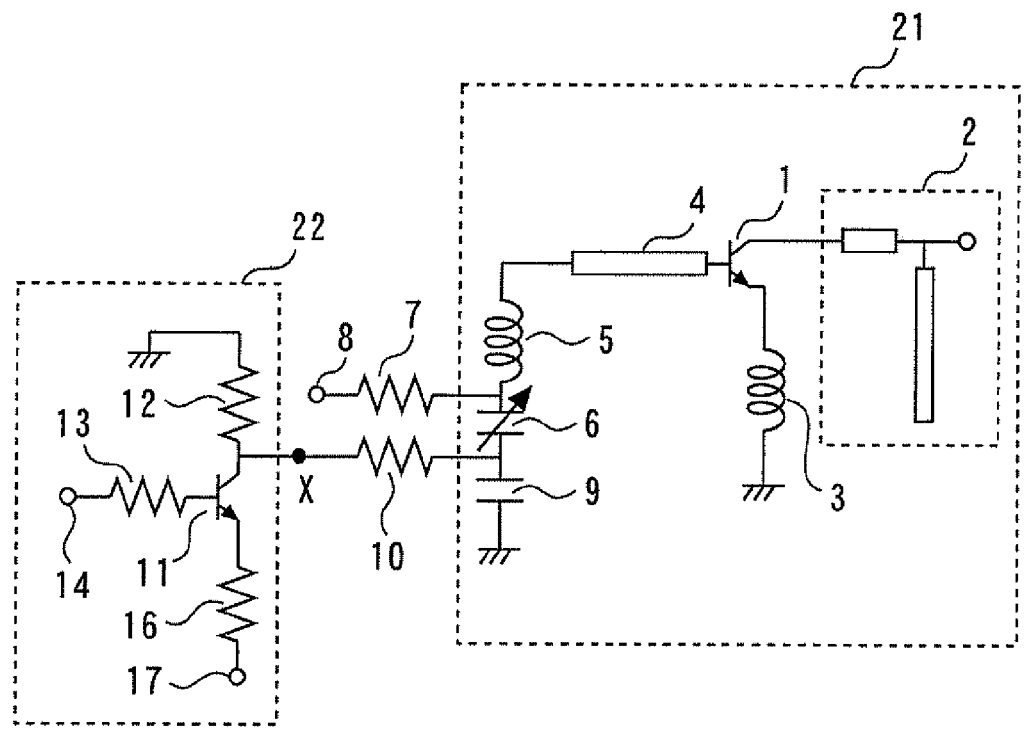
FIG. 1 is a circuit diagram showing a voltage-controlled oscillator according to a first embodiment of the present invention.

FIG. 1 is a circuit diagram showing a voltage-controlled oscillator according to a first embodiment of the present invention. This voltage-controlled oscillator has a voltage-controlled oscillation section 21 which controls the oscillation frequency by a voltage applied to a variable-capacitance element 6, a frequency control bias circuit 7 which applies a frequency control bias to one end of the variable-capacitance element 6, a temperature compensation bias circuit 10 which applies a temperature compensation bias to the other end of the variable-capacitance element 6, and a temperature compensation bias generation circuit 22 which generates the temperature compensation bias and supplies the generated bias to the temperature compensation bias circuit 10.

The voltage-controlled oscillation section 21 has a bipolar transistor 1, an output matching circuit 2 connected to the collector of the bipolar transistor 1, a series feedback inductor 3 connected to the emitter of the bipolar transistor 1, a phase adjustment line 4 having its one end connected to the base of the bipolar transistor 1 and satisfying an oscillation start phase condition, an inductor 5 and the variable-capacitance element 6. The inductor 5 and the variable-capacitance element 6 are connected between the other end of the phase adjustment line 4 and a grounding point and constitute an LC series resonance circuit. The voltage-controlled oscillation section 21 also has a direct current blocking capacitor 9 connected between the variable-capacitance element 6 and a grounding point. The variable-capacitance element 6 is implemented, for example, by using a pn junction diode or a schottky junction diode in an off state.

The frequency control bias circuit 7 is a resistance-feed-type bias circuit which applies to one end of the variable-capacitance element 6 a frequency control bias externally supplied through a frequency control bias terminal 8. The temperature compensation bias generation circuit 22 is also a resistance-feed-type bias circuit. A frequency control bias supplied from the temperature compensation bias generation circuit 22 via point X is applied to the other end of the variable-capacitance element 6.

The temperature compensation bias generation circuit 22 has a bipolar transistor 11 which has its collector connected to the temperature compensation bias circuit 10, and which generates a compensation voltage according to temperature, a resistor 12 (first resistor) which has its one end connected to the collector of the bipolar transistor 11 and has the other end grounded, and which converts a change with temperature in the collector current of the bipolar transistor 11 into a voltage, a resistor 13 (second resistor) which has its one end connected to the base of the bipolar transistor 11, and which controls a change with temperature in the collector current of the bipolar transistor 11, a base bias application terminal 14 which is connected to the other end of the resistor 13, and from which a base bias is applied to the bipolar transistor 11, a resistor 16 (third resistor) which has its one end connected to the emitter of the bipolar transistor 11, and which controls a change with temperature in the collector current of the bipolar transistor 11, and an emitter bias application terminal 17 which is connected to the other end of the resistor 16, and from which a bias is applied to the emitter of the bipolar transistor 11.

Figure 2:
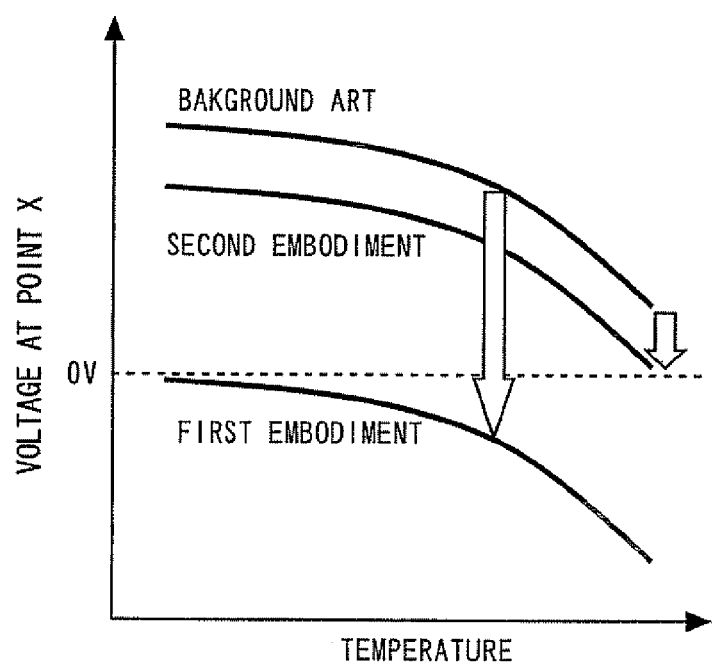
FIG. 2 is a diagram schematically showing voltage characteristics at point X shown in FIGS. 1, 3, and 6.

When the temperature rises during the operation of the voltage-controlled oscillator having the above-described configuration, the collector current of the bipolar transistor 11 increases to increase the voltage drop across the resistor 12. The voltage at point X is thereby reduced as shown in FIG. 2. The voltage across the variable-capacitance element 6 is thereby increased to shift the oscillation frequency to a value on the high-frequency side. Thus, variation in oscillation frequency with temperature can be easily corrected without externally applying a compensation voltage according to temperature.

The collector of the bipolar transistor 11 is grounded and a negative voltage is applied to the emitter bias application terminal 17. Therefore the voltage at point X shown in FIG. 1 is also negative. The voltage at point X changes according to the collector current of the bipolar transistor 11 with respect to different temperatures, and has a voltage characteristic such as shown in FIG. 2 since the voltage drop across the resistor 12 is reduced at a low temperature at which the collector current is reduced. Since the voltage at point X is negative, the range of voltage applicable across the variable-capacitance element can be shifted to a higher-frequency region in comparison with the conventional art shown in FIG. 6.

In this embodiment, the bipolar transistor 11 is used as a device for generating a voltage for controlling a change with temperature. However, a field effect transistor (FET) having temperature characteristics similar to those of the bipolar transistor may alternatively be used. In such a case, the drain of the FET is connected to the temperature compensation bias circuit; one end of the resistor 12 (first resistor) is connected to the drain of the FET; one end of the resistor 13 (second resistor) is connected to the gate of the FET; a gate bias application terminal is used in place of the base bias application terminal 14; this gate bias application terminal is connected to the other end of the resistor 13, one end of the resistor 16 (third resistor) is connected to the source of the FET; and a source bias application terminal is used in place of the emitter bias application terminal 17.

While use of both the resistors 13 and 16 for control of the temperature characteristics of the bipolar transistor 11 has been described, use of only one of them is also possible.

This embodiment has been described as a series-feedback-type voltage-controlled oscillator using a bipolar transistor as an active element in a voltage-controlled oscillation section and having one LC series resonance circuit connected to the base of the transistor. According to the present invention, however, the kind of the active element, the kind of the resonance circuit, the number of the resonance circuits and the connection position of the resonance circuit can be freely selected. For example, an FET may be used as the active element, and a plurality of resonance circuits may be connected to terminals other than the base of the transistor. The present invention can also be applied to a parallel feedback type of voltage-controlled oscillator.

In this embodiment, resistor-feedback-type bias circuits are used as the frequency control bias circuits 7 and 19. The present invention, however, is independent of the kind of bias circuit. Therefore, a ¼ wavelength short stub type of bias circuit or the like for example may be used. The bias circuit for the bipolar transistor 1 is omitted for ease of description.

The above-described circuit may be integrally formed on a semiconductor substrate like an MMIC for example or may be made by mounting the circuit components after forming a transmission line pattern on a ceramic substrate or the like.

Second Embodiment

Figure 3:
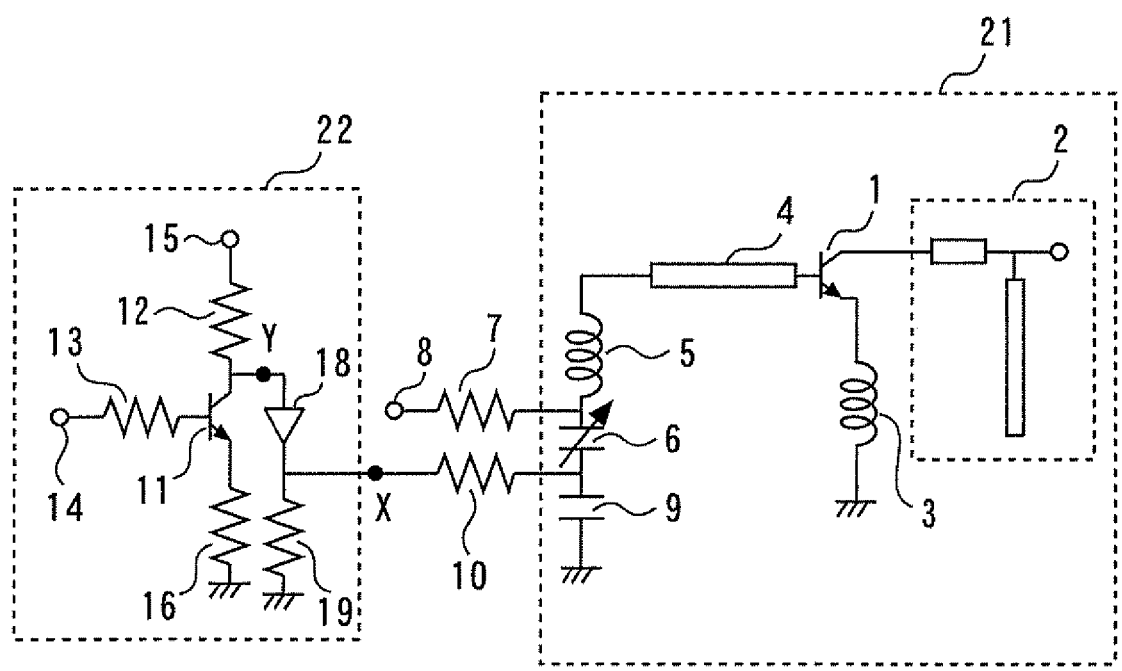
FIG. 3 is a circuit diagram showing a voltage-controlled oscillator according to a second embodiment of the present invention.
Figure 4:
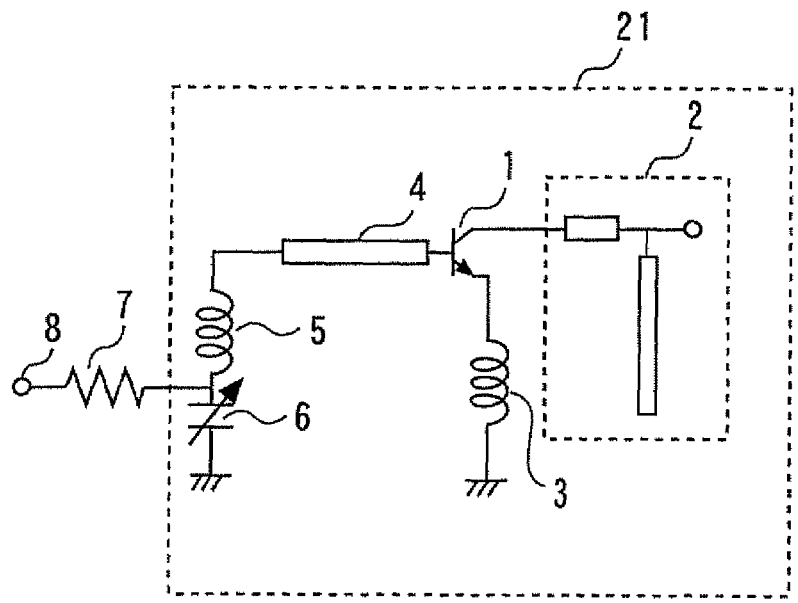
FIG. 4 is a circuit diagram showing an example of a conventional voltage-controlled oscillator.
Figure 5:
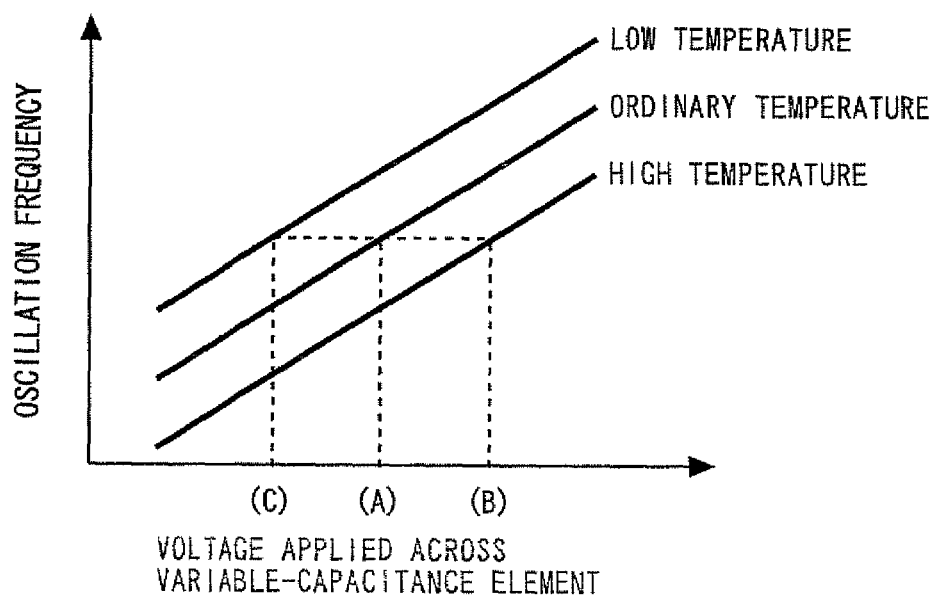
FIG. 5 is a diagram schematically showing oscillation frequency characteristics of the conventional voltage-controlled oscillator.

FIG. 3 is a circuit diagram showing a voltage-controlled oscillator according to a second embodiment of the present invention. This voltage-controlled oscillator differs from that in the first embodiment in the internal configuration of the temperature compensation bias generation circuit 22.

The temperature compensation bias generation circuit 22 according to the second embodiment has a diode 18 which has its cathode connected to the temperature compensation bias application circuit, and which reduces the voltage at point Y by a value corresponding to its on voltage, a bipolar transistor 11 having its collector connected to the anode of the diode 18, a resistor 12 (first resistor) having its one end connected to the collector of the bipolar transistor 11, a resistor 13 (second resistor) having its one end connected to the base of the bipolar transistor 11, a base bias application terminal 14 connected to the other end of the resistor 13, a collector bias application terminal 15 which is connected to the other end of the resistor 12, and from which a collector bias is applied to the bipolar transistor 11, a resistor 16 (third resistor) having its one end connected to the emitter of the bipolar transistor 11 and having the other end grounded, and a resistor 19 (fourth resistor) having its one end connected to the temperature compensation bias application circuit and having the other end grounded.

When the temperature rises during the operation of the voltage-controlled oscillator having the above-described configuration, the collector current of the bipolar transistor 11 increases to increase the voltage drop across the resistor 12. The voltage at point X is thereby reduced as shown in FIG. 2. The voltage across the variable-capacitance element 6 is thereby increased to shift the oscillation frequency to a value on the high-frequency side. Thus, variation in oscillation frequency with temperature can be easily corrected without externally applying a compensation voltage according to temperature.

Figure 6:
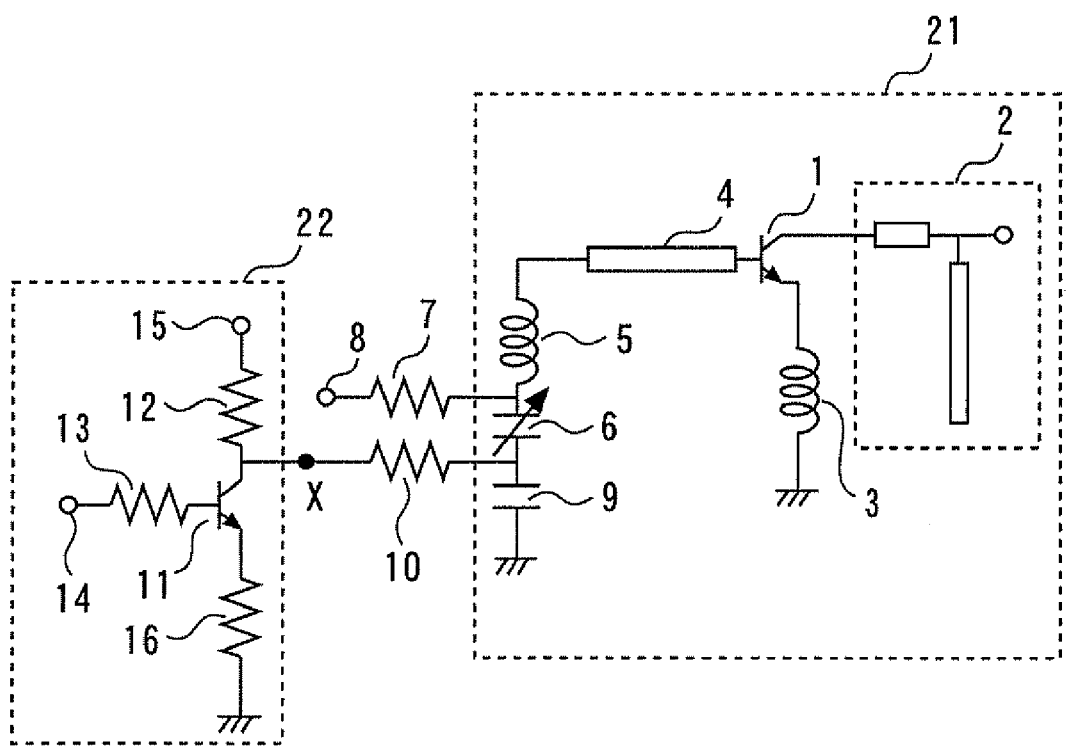
FIG. 6 is a circuit diagram showing another example of the conventional voltage-controlled oscillator.
Figure 7:
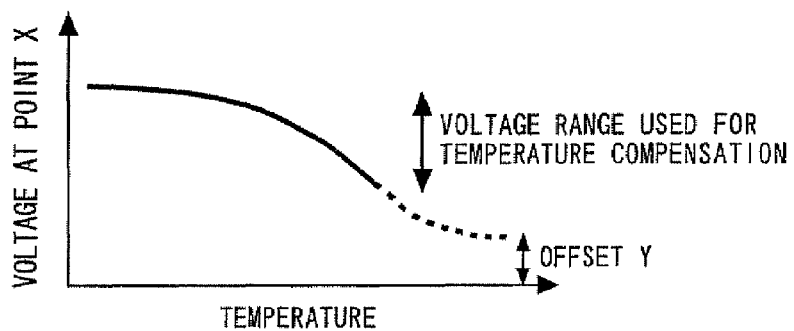
FIG. 7 is a diagram schematically showing a voltage characteristic at point X of the circuit shown in FIG. 6.
Figure 8:
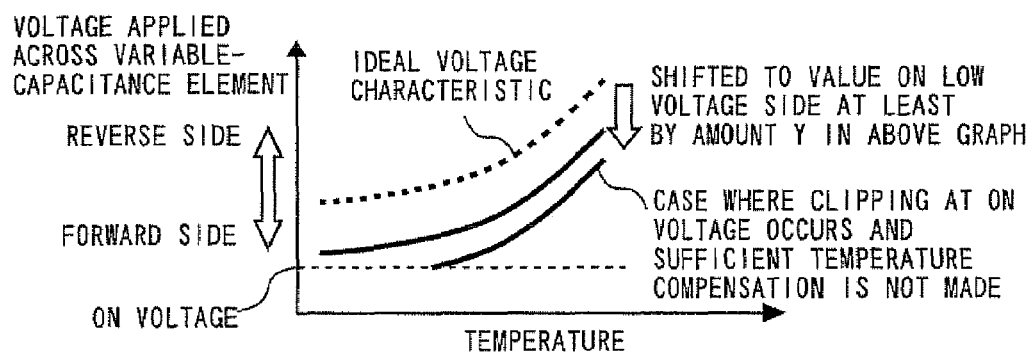
FIG. 8 is a diagram schematically showing characteristics of the voltage applied across the variable-capacitance element in the circuit shown in FIG. 6.

The diode 18 reduces the voltage by a value corresponding to its on voltage, so that the voltage at point X can be reduced as shown in FIG. 2 relative to that in the conventional art shown in FIG. 6, and the range of voltage applicable across the variable-capacitance element can be shifted to a region on the higher-voltage side in comparison with the conventional art shown in FIG. 6.

In this embodiment, the bipolar transistor 11 is used as a device for generating a voltage for controlling a change with temperature. However, a FET having temperature characteristics similar to those of the bipolar transistor may alternatively be used. In such a case, the drain of the FET is connected to the anode of the diode 18; one end of the resistor 12 (first resistor) is connected to the drain of the FET; one end of the resistor 13 (second resistor) is connected to the gate of the FET; a gate bias application terminal is used in place of the base bias application terminal 14; this gate bias application terminal is connected to the other end of the resistor 13: one end of the resistor 16 (third resistor) is connected to the source of the FET; and a drain bias application terminal is used in place of the collector bias application terminal 15.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-347456, filed on Dec. 1, 2005 including specification, claims, drawings and summary, on which the Convention priority of the present application is based, are incorporated herein by reference in its entirety.

What is claimed is:

1. A voltage-controlled oscillator comprising:
   a voltage-controlled oscillation section which controls oscillation frequency through a voltage applied to a variable-capacitance element;
   a frequency control bias circuit which applies a frequency control bias to a first end of the variable-capacitance element;
   a temperature compensation bias circuit which applies a temperature compensation bias to a second end of the variable-capacitance element; and
   a temperature compensation bias generation circuit which generates the temperature compensation bias and supplies the temperature compensation bias generated to the temperature compensation bias circuit, the temperature compensation bias generation circuit having:
a transistor having a collector or drain connected to the temperature compensation bias circuit, a base or a gate, and an emitter or a source;
a first resistor having a first end connected to the collector or drain of the transistor and having a second end that is grounded;
a second resistor having a first end connected to the base or gate of the transistor;
a base or gate bias application terminal connected to the other end of the second resistor;
a third resistor having a first end connected to the emitter or source of the transistor; and
an emitter or source bias application terminal connected to the other end of the third resistor.

2. A voltage-controlled oscillator comprising:
a voltage-controlled oscillation section which controls oscillation frequency through a voltage applied to a variable-capacitance element;
a frequency control bias circuit which applies a frequency control bias to a first end of the variable-capacitance element;
a temperature compensation bias circuit which applies a temperature compensation bias to a second end of the variable-capacitance element; and
a temperature compensation bias generation circuit which generates the temperature compensation bias and supplies the temperature compensation bias generated to the temperature compensation bias circuit, the temperature compensation bias generation circuit having:
a diode having a cathode connected to the temperature compensation bias application circuit;
a transistor having a collector or drain connected to the anode of the diode, a base or a gate, and an emitter or a source;
a first resistor having a first end connected to the collector or drain of the transistor;
a collector or drain bias application terminal connected to a second end of the first resistor;
a second resistor having a first end connected to the base or gate of the transistor;
a base or gate bias application terminal connected to a second end of the second resistor;
a third resistor having a first end connected to the emitter or source of the transistor and having a second end that is grounded; and
a fourth resistor having a first end connected to the temperature compensation bias application circuit and having a second end that is grounded.

* * * * *